United States Patent [19]
Parks et al.

[11] Patent Number: 5,465,346
[45] Date of Patent: Nov. 7, 1995

[54] METHOD AND APPARATUS FOR SYNCHRONOUS BUS INTERFACE OPTIMIZATION

[75] Inventors: Terry J. Parks, Round Rock; Darius D. Gaskins, Austin, both of Tex.

[73] Assignee: Dell USA, L.P., Austin, Tex.

[21] Appl. No.: 102,446

[22] Filed: Aug. 5, 1993

Related U.S. Application Data

[63] Continuation-in-part of Ser. No. 816,313, Dec. 30, 1991, Pat. No. 5,245,231.
[51] Int. Cl.⁶ .................. G06F 13/00; G06F 13/36
[52] U.S. Cl. ................. 395/296; 364/DIG. 1; 364/239; 364/240.8; 364/270.5; 364/271; 364/271.5; 395/861
[58] Field of Search ........................ 395/325, 425, 395/500, 550; 371/37; 364/200, DIG. 1

[56] References Cited

U.S. PATENT DOCUMENTS

| | | | |
|---|---|---|---|
| 4,775,929 | 10/1988 | Jzbicki et al. | 364/200 |
| 4,827,477 | 5/1989 | Avaneas | 371/37 |
| 4,972,345 | 11/1990 | Munier et al. | 371/295 |
| 5,191,657 | 3/1993 | Ludwig et al. | 395/325 |
| 5,237,670 | 8/1993 | Wakerly | 395/425 |
| 5,255,375 | 10/1993 | Crook et al. | 395/325 |
| 5,265,216 | 11/1993 | Murphy et al. | 395/325 |

*Primary Examiner*—Kevin A. Kriess
*Assistant Examiner*—Majid A. Banankhah
*Attorney, Agent, or Firm*—Jeff Hood; James Huffman

[57] ABSTRACT

A method and apparatus which enables devices connected to a bus to detect and take advantage of the early arrival of bus signal inputs. A signal arrival encoder circuit included in a device encodes the arrival time of a signal input whose early arrival is desired to be detected. The arrival time of the signal at issue is categorized according to a desired degree of precision or granularity depending upon the complexity of the encoder used in the respective embodiment. The encoded signal arrival information is then used by the respective device to determine when to sample the other respective input signal. By detecting the early arrival of this input, the device is not required to wait for the worst case signal arrival time to utilize the information. This considerably increases system performance.

19 Claims, 5 Drawing Sheets

METHOD AND APPARATUS FOR SYNCHRONOUS BUS INTERFACE OPTIMIZATION

This is a continuation-in-part of U.S. patent application Ser. No. 816,313, now U.S. Pat. No. 5,245,231, filed Dec. 30, 1991, whose inventors are Thomas J. Kocis and Darius D. Gaskins, and which is assigned to Dell USA, L.P.

FIELD OF THE INVENTION

The present invention relates to bus operations in computer systems, and more specifically to a method and apparatus which enables devices to detect and take advantage of the early arrival of bus signal inputs, thus improving system performance.

DESCRIPTION OF THE RELATED ART

Computer systems typically include one or more buses to interconnect the various components comprising the computer system. Computer system buses may be classified as either synchronous or asynchronous. In an asynchronous bus design, the various bus signals do not operate according to a common system or bus clock, but rather the various devices coupled to the bus utilize various handshake signals to perform operations. For example, FIG. 1 illustrates a simple asynchronous data transfer, a CPU read from memory. In FIG. 1, the processor generates a valid address at point A and then asserts an address strobe signal at point B. When the memory detects the address strobe signal, it places data on the data bus which becomes valid at point C. The memory then informs the processor that it has valid data by asserting a data acknowledge signal at point D. The processor detects that the data is now ready, reads the data, and negates its address strobe signal to indicate that it has read the data at point E. The memory then negates its data acknowledge signal at point F to complete the cycle.

In a synchronous bus design, the signals or operations that are carried by the bus operate according to a common system or bus clock. For example, FIG. 2 illustrates a simple synchronous data transfer, a CPU read from memory. At point A, a read cycle begins with the rising edge of the clock signal. At point B, the CPU generates an address corresponding to the memory location being accessed. At point C, the memory yields its data for the CPU to read. The current cycle ends at D with the rising edge of the clock signal. The time between C and D is referred to as the data setup time or $t_{setup}$ of the CPU. The value $t_{setup}$ represents the minimum time for which data must be stable on the bus before the rising edge of the clock signal at point D. The time after point D, referred to as $t_{hold}$, is referred to as the data hold time and is the minimum time for which the data must be held stable after the clock signal has been transitioned.

A bus typically includes a bus specification which sets forth minimum and maximum response times for the various devices operating according to the bus specification. As shown above, synchronous bus interfaces utilize inputs which are typically specified with setup and hold times to an edge of a bus clock. This generally leaves a large window in which incident signals may arrive. Further, the bus interface portion of devices that are designed to operate according to a respective bus specification are typically designed assuming worst case arrival times of inputs. This assures normal operation regardless of the individual device characteristics of other devices coupled to the bus. However, this prevents these devices from taking advantage of the early arrival of critical signals which can improve system performance. Therefore, a method and apparatus is desired which allows the various devices connected to a bus to detect and take advantage of the early arrival of input signals while operating compatibly with devices which do not provide early arrival of signals.

SUMMARY OF THE INVENTION

The present invention comprises a simple and reliable method and apparatus which enables devices connected to a bus to detect and take advantage of the early arrival of bus signal inputs. By detecting the early arrival of these inputs, the device is not required to wait for the entire setup and hold time which is required for prior art devices. This considerably increases system performance.

A signal arrival encoder circuit included in a device encodes the instantaneous delay coefficient of the driver of the respective bus signal input(s) whose early arrival is desired to be detected. In one embodiment, the signal arrival encoder includes a number of delay elements connected serially such that the output of one delay element is connected to the input of the next and so on. The outputs of each of the delay elements are connected to D-type flip-flops. The respective input signal is provided to the input of the first delay element. At a first clock edge, a logic circuit analyzes the contents of the flip-flops to determine whether the input signal was early or late. The arrival time of the signal at issue is categorized according to a desired degree of precision or granularity depending upon the complexity of the encoder used in the respective embodiment. The encoded signal arrival information is saved and used later by the respective device on a subsequent bus cycle to determine when to sample the respective input signal.

In a second embodiment of the signal arrival encoder, the clocking signal is provided through a delay line to the clock input of a flip-flop, and the input signal is connected to the D input of the flip-flop. When the delayed clock signal is asserted, the flip-flop latches the input signal and determines if the signal has been asserted. If the input signal has been asserted, the signal is categorized as fast. Otherwise the signal is categorized as slow. This arrival information is then used by the device in that same bus cycle to determine when to sample the respective input signal.

In the preferred embodiment, the present invention is incorporated into a cache controller's cache hit logic. In this embodiment, it is assumed that zero wait state access to the cache memory is possible under fast operating conditions, i.e. early address arrival times, and one wait state is required for later address arrival times. The signal arrival encoder samples the address strobe signal output from the CPU on the respective bus cycle and categorizes the signal as either fast or slow depending on a certain arrival threshold. Depending on the signal arrival encoder used, the cache hit logic in the cache controller uses the arrival information either from the immediately prior bus cycle or the current bus cycle in determining when to return a bus ready signal in response to the address strobe signal output from the CPU. If an early address arrival time is detected, the bus ready signal is returned in zero wait states. If a late address arrival time is detected, then a wait state is used to delay assertion of the bus ready signal for an additional cycle. Therefore, where input signals to a respective device have early arrival times, and the device includes logic according to the present invention, the device can perform operations in a reduced number of bus cycles. This significantly increases computer system performance.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
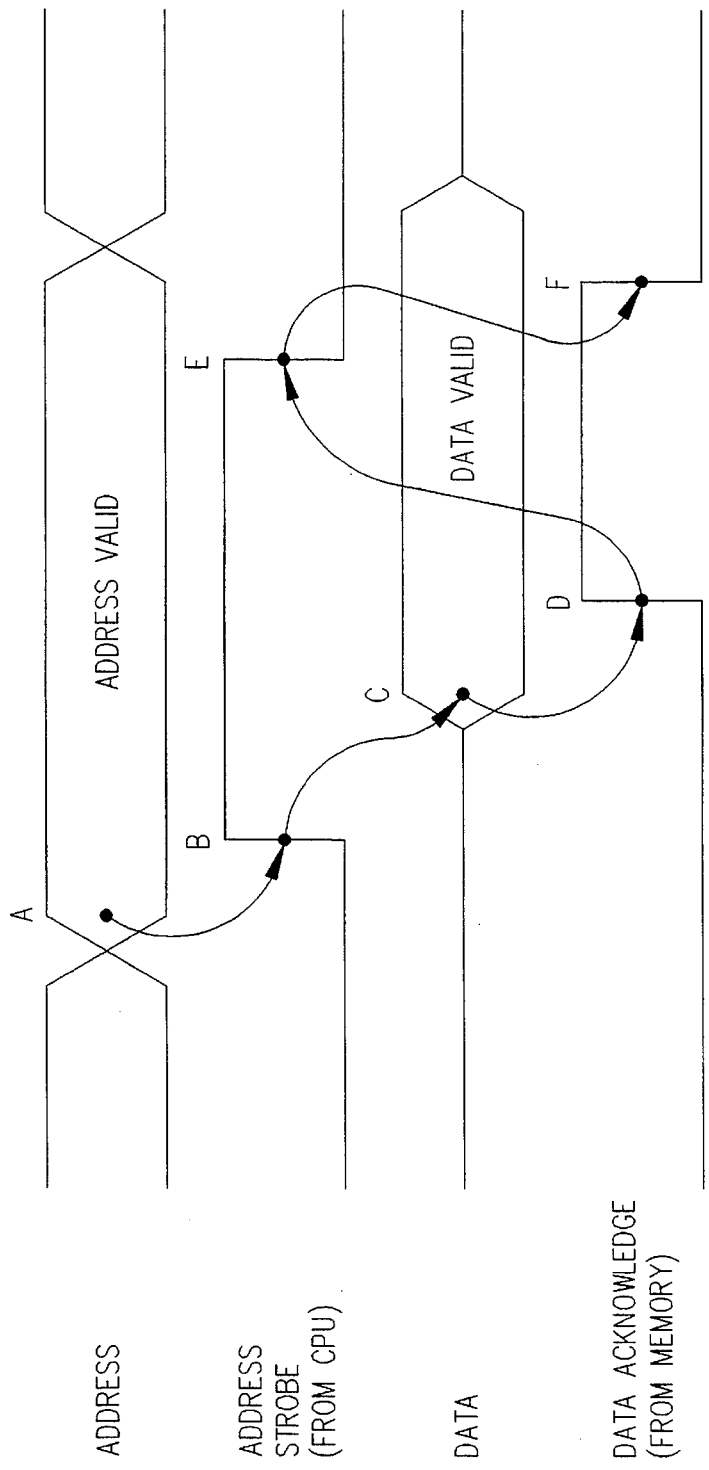
FIG. 1 is a prior art diagram illustrating an asynchronous data transfer.
Figure 2:
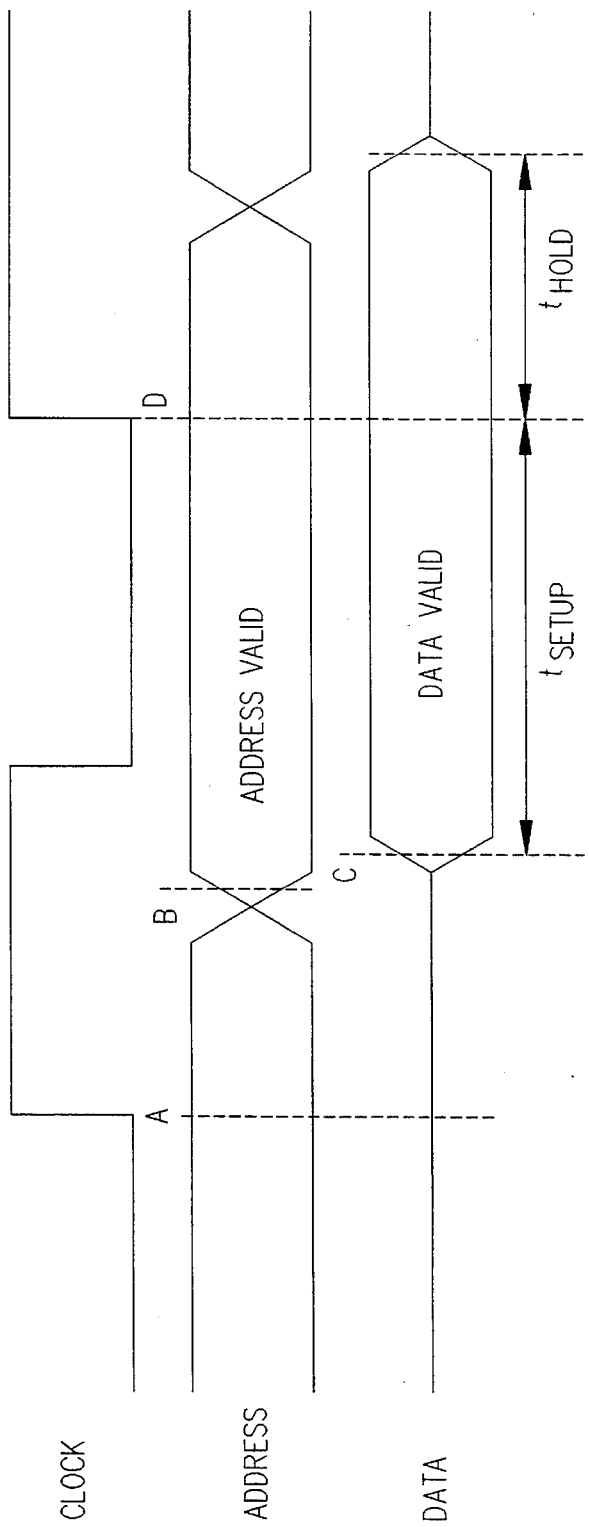
FIG. 2 is a prior art diagram illustrating a synchronous data transfer.
Figure 3:
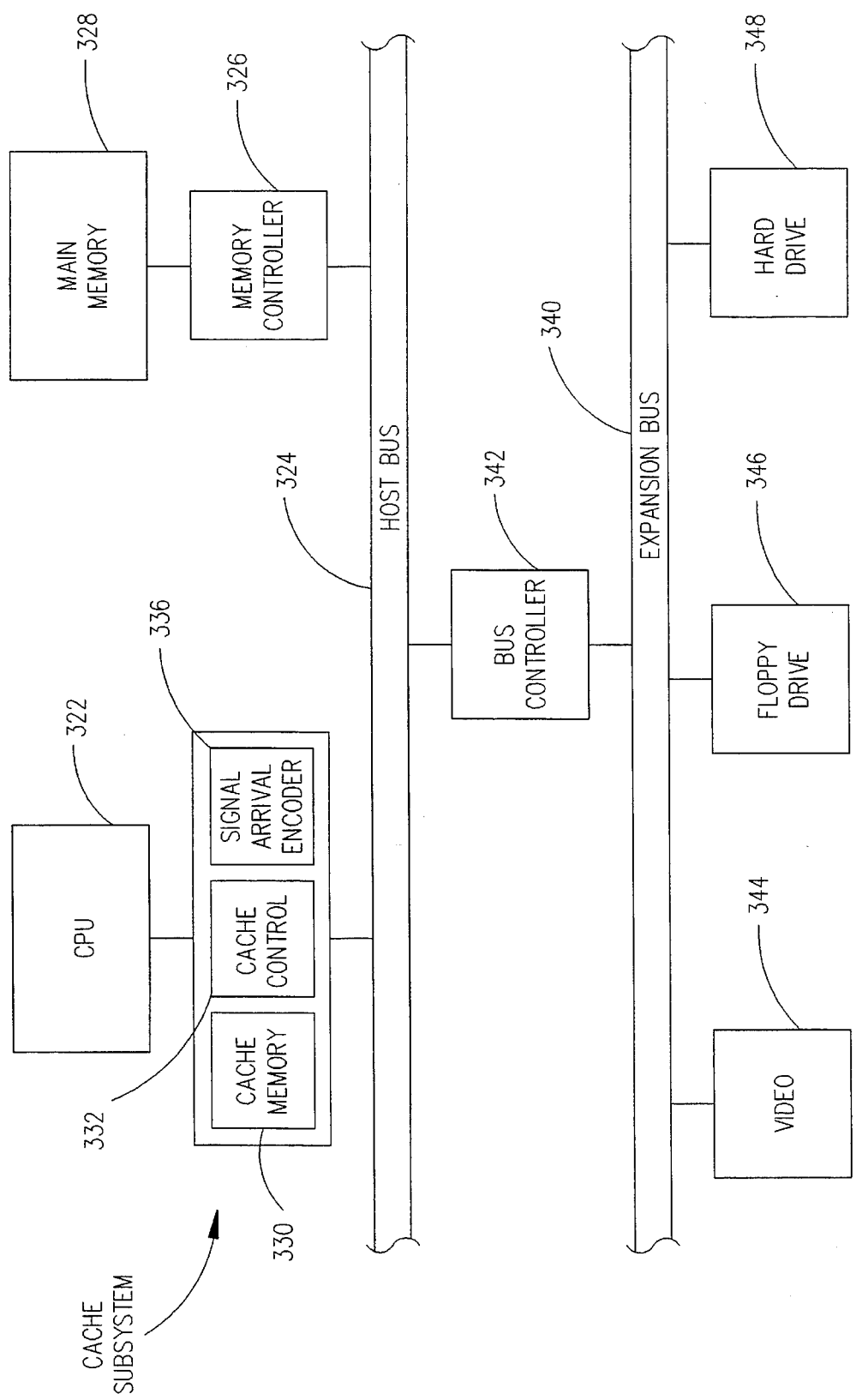
FIG. 3 illustrates a computer system according to the preferred embodiment of the invention.

Referring now to FIG. 3, a computer system incorporating logic according to the present invention is shown. The elements of a computer system not necessary to understand the operation of the present invention have been omitted for simplicity. Also, in the description that follows, signal names followed by an "n" indicate that the signal is asserted when it has a logic low value.

The computer system includes a central processing unit or CPU 322 which is coupled to a memory or host bus 324. The CPU 322 preferably includes a cache subsystem coupled between the CPU 322 and host bus 324. The cache subsystem comprises cache memory 330 and a cache controller 332. The cache subsystem also includes a signal arrival encoder 336 according to the present invention which samples input signals from the CPU 322 and categorizes the performance of these input signals. The cache controller 332 uses this encoded signal arrival information to reduce the number of bus cycles required for tag compare operations according to the present invention, as discussed below.

The host bus 324 includes address, data, and control portions. Main memory 328 is coupled to the host bus 324 by means of memory controller 326. The host bus 324 is coupled to an expansion or input/output (I/O) bus 340 by means of a bus controller 342. The expansion bus 340 includes slots for various other devices, including video 344, a floppy drive 346 and hard drive 348.

In the embodiment shown in FIG. 3, signal arrival encoder logic 336 is shown incorporated into a cache subsystem. However, it is noted that the logic of the present invention can be incorporated into any of the devices illustrated in FIG. 3 as well as other devices not shown in FIG. 3. In the embodiment of FIG. 3, it is assumed that zero wait state access to tag memory in the cache subsystem is possible under fast operating conditions, i.e. early address arrival times, and one wait state is required for later address arrival times. The signal arrival encoder 336 samples the address strobe signal ADSn output from the CPU 322 on each bus cycle and categorizes the signal accordingly. In the preferred embodiment, the CPU 322 outputs its address strobe signal ADSn in conjunction with its addressing signals A<31:0>, and thus detection of the ADSn signal corresponds to detection of the A<31:0> signals.

The signal arrival encoder 336 categorizes the ADSn signal as either fast or slow depending on a certain arrival threshold relative to the bus clocking signal CLK. Thus only the smallest amount of granularity is detected in the preferred embodiment. However, it is noted that greater amounts of granularity can be detected, as desired. The CLK signal preferably has a period of 20 nanoseconds (ns). Although the categorization of the ADSn signal will generally depend on testing performed in the cache system, in the preferred embodiment the ADSn signal is categorized as fast, and thus the addresses A(31:0) can be used on the next rising edge of the CLK signal, if it is asserted at least 12 ns prior to the rising edge of the CLK signal.

Cache hit logic (FIG. 6) in the cache controller 332 uses the arrival information from the signal arrival encoder 336 in determining when to return the bus ready signal BRDYn in response to the ADSn signal and addressing signals A<31:0> output from the CPU 322. If an early address arrival time is detected, the BRDYn signal is returned in zero wait states. If a late address arrival time is detected, then a wait state is used to delay assertion of the BRDYn signal for an additional cycle. Therefore, where input signals to a respective device have early arrival times, and the device includes logic according to the present invention, the device can perform operations in a reduced number of bus cycles. This significantly increases computer system performance.

Figure 4:
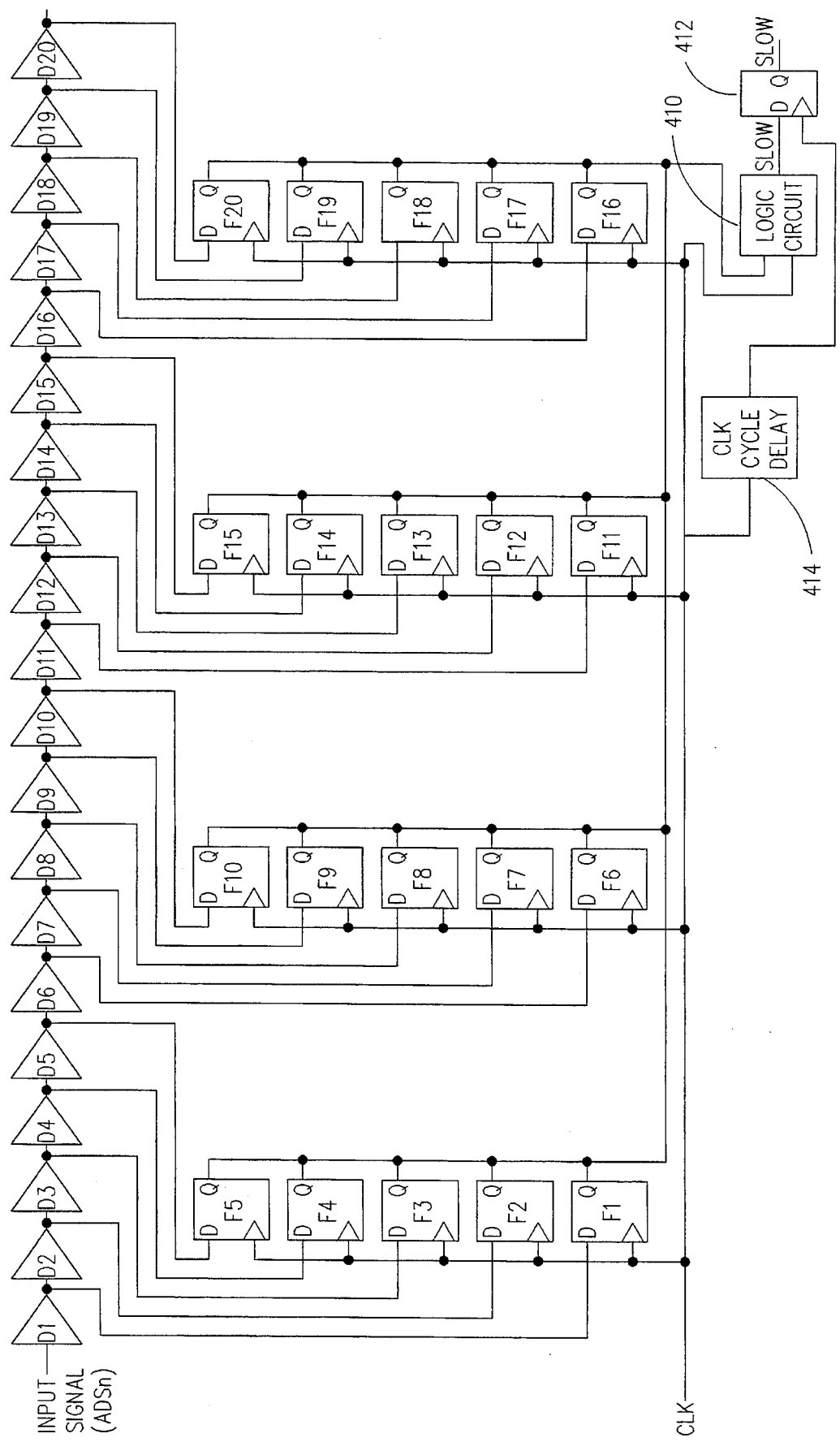
FIG. 4 illustrates a signal arrival encoder according to one embodiment of the invention.

Referring now to FIG. 4, the signal arrival encoder 336 according to one embodiment of the invention is shown. In the embodiment shown in FIG. 4, the signal arrival encoder 336 provides signal arrival information that can only be used later on subsequent bus cycles. In other words, the signal arrival information is saved and used on a later bus cycle where the respective input signal will be asserted. In the preferred embodiment using the signal arrival encoder shown in FIG. 5, the signal arrival information can be used on that same bus cycle.

As shown in FIG. 4, the signal arrival encoder 336 includes a plurality of delay elements D1–D20 connected together whereby the output of one delay element is connected to the input of the next delay element and so on. In this embodiment, 20 delay elements D1–D20 are used which each provide a 1 ns delay over all operating conditions. However, more or less delay elements may be used depending on the desired degree of precision or granularity, the amount of delay provided by each delay element, and the timing of the signal being detected.

The input signal desired to be detected, ADSn in the preferred embodiment, is connected to the input of the first delay element D1, as shown. The outputs of each of the delay elements D1–D20 are connected to corresponding D-type flip-flops F1–F20 as shown. The bus clocking signal CLK is connected to the clock input of each of the flip-flops F1–F20. The Q outputs of each of the flip-flops F1–F20 are connected to a logic circuit 410. The logic circuit 410 also receives the CLK signal. The logic circuit 410 outputs a signal referred to as SLOW which is preferably provided to the D input of a D-type flip-flop 412. The CLK signal is connected through a 20 ns or CLK signal cycle delay element 414 to the clock input of the flip-flop 412. Thus the SLOW bit is stored in the flip-flop 412 on the next CLK signal cycle.

The SLOW bit is stored so that it can be used on a subsequent bus cycle. Otherwise, since the ADSn signal is monitored by the signal arrival encoder 336 of FIG. 4 on every CLK signal cycle, not just those cycles where the ADSn signal is actually asserted, subsequent bus cycles where the ADSn signal is not asserted may change the status of the SLOW signal and erroneously indicate that the ADSn signal is slow or has a late arrival time. Thus, the ADSn signal is stored in the flip-flop 412 on the following CLK signal edge. Also, the contents of the flip-flop 412 are only changed by the logic circuit 410 when one of the flip-flops F1–F20 indicates that the ADSn signal was asserted in that CLK signal window. This guarantees that the status of the SLOW signal will only be changed on a subsequent bus cycle when the ADSn signal is again asserted.

At the rising edge of the CLK signal, the logic circuit 410 analyzes which of signals output from the flip-flops F1–F20 are asserted. For example, if the ADSn signal is asserted five ns into the CLK signal window, i.e., 15 ns before the rising CLK signal edge at issue, then the first 15 of the delay elements D1–D15 will reflect the assertion of the ADSn signal on the rising edge of the CLK signal. In this instance, the output signals from flip-flops F1–F15 will be asserted. Similarly, if the ADSn is asserted eight ns before the rising edge of the CLK signal where possible latching could occur, then the first eight delay elements D1–D8 will reflect the assertion of the ADSn signal on the rising edge of the CLK signal. In this instance, the output signals from flip-flops F1–F8 will be asserted.

As previously mentioned, the logic circuit 410 outputs a bit referred to as SLOW which reflects the arrival time of the ADSn signal relative to the CLK signal edge. In the preferred embodiment, if the ADSn signal is asserted twelve or more ns before the rising edge of the CLK signal, then the SLOW bit is negated, indicating an early arrival time. Thus, on the next tag compared cycle where the ADSn signal is asserted the cache state tracker logic (FIG. 6) can use in the addressing signals A<31:0> on that CLK signal edge. If the ADSn signal is asserted less than twelve ns before the rising edge of the CLK signal where possible latching could occur, then the ADSn signal was not asserted in time for the addresses to be used on that rising edge of the CLK signal. Thus, on the next tag compare cycle, the cache state tracker logic is required to insert a wait state to wait an additional CLK signal cycle before using the addressing signals A<31:0>. It is noted that the operation of the signal arrival encoder 336 of FIG. 4, whereby the SLOW bit is saved for use the next time the ADSn signal is asserted, assumes similar assertion of the ADSn signal in consecutive tag compare cycles.

Therefore, when the CLK signal is asserted, the logic circuit 410 analyzes the signals output from the flip-flops F1–F20. If flip-flop F12 is asserted, then the ADSn signal was asserted twelve or more ns before the next rising edge of the CLK signal. This indicates an early arrival time, and the SLOW signal is negated. If flip-flop F12 is not asserted, then the ADSn signal was asserted less than 12 ns before the next rising edge of the CLK signal. This indicates a late arrival time, and the SLOW signal is asserted.

Figure 5:
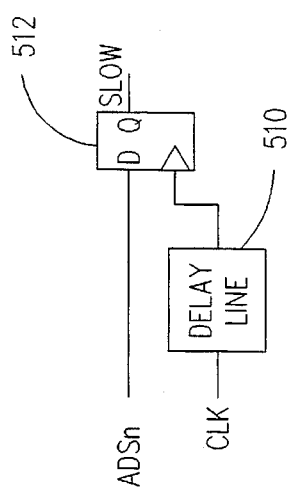
FIG. 5 illustrates a signal arrival encoder according to the preferred embodiment of the invention.

Referring now to FIG. 5, an alternate and preferred embodiment of the signal arrival encoder 336 is shown. The CLK signal is provided to the input of a delay line 510 whose output is provided to the clock input of a D-type flip-flop 512. The delay line 510 is preferably comprised of delay elements as shown in FIG. 4. However, the delay line 510 may also be comprised of logic as shown in related co-pending application Ser. No. 816,313, now U.S. Pat. No. 5,245,231 titled "Integrated Delay Line" which is assigned to the same assignee as the present application, and which is hereby incorporated by reference. The ADSn signal is connected to the D input of the flip-flop 512 and the Q output of the flip-flop 512 is the SLOW signal.

The delay line 510 preferably delays the CLK signal eight ns in the preferred embodiment. When the delayed CLK signal edge arrives at the clock input of the flip-flop 512, the flip-flop 512 determines whether the ADSn signal has been asserted. If the ADSn signal has been asserted by this time, then an early arrival has been detected and the SLOW signal is a logic low value representing an early arrival time. If the ADSn signal has not been asserted low within eight ns into the CLK signal window, then the SLOW signal is a logic high value to indicate a late arrival time.

In the embodiment shown in FIG. 5, the SLOW signal is asserted in sufficient time to allow the signal to be used in that same bus cycle. This is in contrast to the embodiment of the signal arrival encoder 336 shown in FIG. 4, wherein the SLOW bit must be saved in the flip-flop 412 for use in the next bus cycle where the ADSn signal is asserted. The embodiment of the signal arrival encoder 336 shown in FIG. 5 thus provides a more accurate determination of whether the current ADSn signal actually has an early or late arrival time. For more information on alternative embodiments of the signal arrival encoder used in the present invention, please see related co-pending applications Ser. No. 816,313, now U.S. Pat. No. 5,245,231, titled "Integrated Delay Line" and Ser. No. 08/089,873 titled "Method and Apparatus for State Machine Optimization", both of which are assigned to the same assignee as the present application, and which are hereby incorporated by reference.

Figure 6:
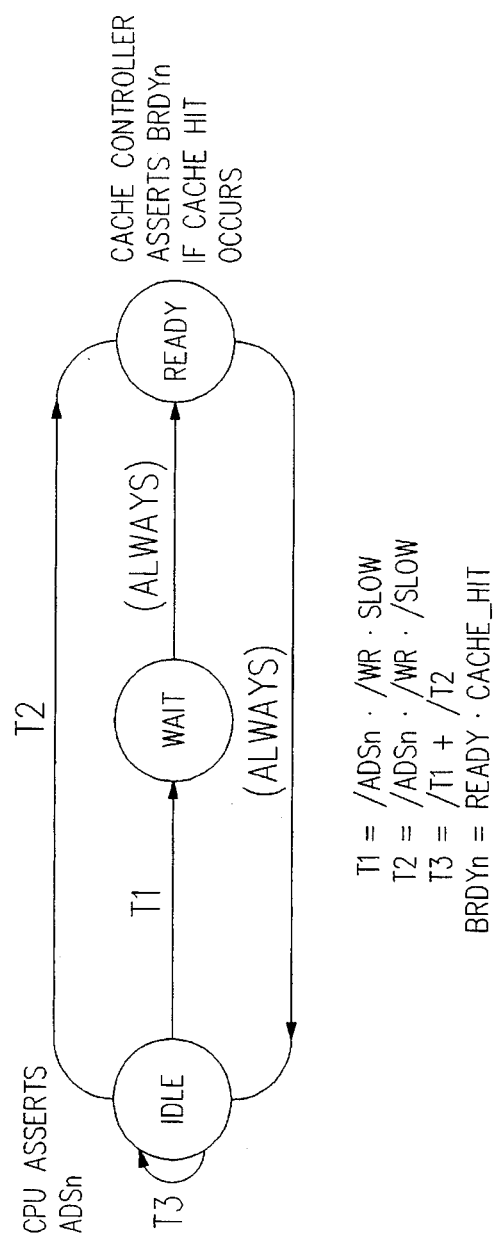
FIG. 6 is a state transition diagram illustrating operation of cache hit state tracker logic utilizing the signal arrival information produced by the signal arrival encoder in either FIGS. 4 or 5.

Referring now to FIG. 6, a state transition diagram illustrating operation of cache hit state tracker logic in the cache controller 332 of FIG. 3 is shown. The cache hit logic is normally in the IDLE state and remains in the IDLE state while the condition /T1+/T2 is true. In other words, the cache hit logic remains in its IDLE state when the address strobe signal ADSn is negated or a write cycle is occurring. The cache hit logic advances from its IDLE state to its READY state if the condition:

/ADSn./WR./SLOW is true. Thus the cache hit logic advances directly to the READY state if the ADSn signal is asserted low, the WR signal is negated, indicating a READ cycle, and the SLOW signal is also negated. Therefore, the cache hit logic advances directly from its IDLE state to its READY state when the SLOW signal indicates that the ADSn signal has an early arrival time. In the READY state, the bus ready signal (BRDYn) is asserted if a cache hit occurs, signified by the CACHE_HIT signal being asserted.

The cache hit logic advances from its IDLE state to the WAIT state if the condition:

/ADSn./WR.SLOW is true. Thus, the cache hit logic advances from its IDLE state to its WAIT state when the ADSn signal is asserted low on a READ cycle and the signal arrival information indicates a late arrival time. The WAIT state is used to provide additional time for the ADSn and address signals to be valid on the bus. The cache hit logic advances from its WAIT state to its READY state on the next CLK signal cycle. In the READY state, the BRDYn signal is asserted if a cache hit occurs. The cache hit logic returns from its READY state back to its IDLE state on the next CLK signal cycle and waits for a new ADSn signal to be asserted.

Therefore, the cache hit logic in the cache controller 332 uses the input signal arrival information represented by the SLOW signal or SLOW bit to determine whether the ADSn signal has an early or late arrival time. If the ADSn signal has an early arrival time, then no WAIT states are included in the cycle, and thus no additional clock cycle is required. However, if the signal arrival information indicates that the ADSn signal has a late arrival time, then the SLOW signal is asserted high and a WAIT state is included to provide enough time for the ADSn and addressing signals to be valid on the bus before they are sampled. This enables a device to take advantage of the early arrival of input signals while maintaining compatibility with devices which do not provide an early signal output but yet conform to the respective bus specification being used.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A method for reducing the amount of time required for bus cycles in a computer system having a bus, a first device coupled to the bus which generates a signal, and a second device coupled to the bus which receives the signal as an input, wherein the second device includes a signal arrival encoder which encodes the arrival time of the signal, the method comprising the steps of:

the first device generating a signal on the bus to the second device on a first bus cycle;

the signal arrival encoder monitoring the arrival time of the signal to the second device on said first bus cycle;

the signal arrival encoder encoding said arrival time of the signal into signal arrival information;

the first device generating the signal on the bus to the second device in a subsequent bus cycle, wherein said subsequent bus cycle occurs after said first bus cycle and after said steps of monitoring and encoding;

the second device latching the signal during said subsequent bus cycle, wherein the second device uses said signal arrival information in determining when to latch the signal during said subsequent bus cycle.

2. The method of claim 1, wherein the bus operates according to a clocking signal and wherein the signal arrival encoder monitors the arrival time of the signal to the second device relative to said clocking signal.

3. The method of claim 2, wherein said step of the signal arrival encoder monitoring the arrival time of the signal to the second device on said first bus cycle comprises determining if the signal arrives before or after an edge of said clocking signal;

wherein said step of the signal arrival encoder encoding said arrival time of the signal into signal arrival information comprises encoding said arrival time of the signal into one or more bits indicating an early or late signal arrival time relative to said edge of said clocking signal.

4. The method of claim 3, wherein said signal arrival information comprises one or more bits indicating an early or late signal arrival time;

wherein said step of the second device latching the signal during said subsequent bus cycle using said signal arrival information further comprises:

the second device latching in the signal on a first edge of said clocking signal in said first bus cycle if said one or more indicate an early arrival time; and the second device latching in the signal on a second edge of said clocking signal after said first edge in said first bus cycle if said one or more bits indicate a late arrival time.

5. The method of claim 1, wherein said subsequent bus cycle is the next cycle immediately after said first bus cycle.

6. A computer system including a signal arrival encoder which encodes the arrival time of one or more signals on a bus to reduce the amount of time required for bus cycles in the computer system, the computer system comprising:

a bus;

a first device coupled to the bus which generates a signal; and a second device coupled to the bus which receives said signal as an input and latches said signal from the bus, wherein the second device includes:

a signal arrival encoder including an input coupled to said bus which receives said signal from said first device, where said signal arrival encoder comprises:

means for monitoring the arrival time of the signal to the second device on a first bus cycle; and means for encoding said arrival time of the signal into signal arrival information;

wherein the second device uses said signal arrival information in determining when to latch in the signal from said first device.

7. The computer system of claim 6, wherein the bus operates according to a clocking signal; and wherein the signal arrival encoder includes an input receiving said bus clocking signal, and wherein the signal arrival encoder monitors the arrival time of the signal to the second device relative to said clocking signal.

8. The method of claim 7, wherein said means for monitoring the arrival time of the signal to the second device determines if the signal arrives before or after an edge of said clocking signal;

wherein said means for encoding said arrival time of the signal into signal arrival information encodes said arrival time of the signal into one or more bits indicating an early or late signal arrival time relative to said edge of said clocking signal.

9. The computer system of claim 8, wherein said signal arrival information comprises one or more bits indicating an early or late signal arrival time; wherein the second device latches in the signal on a first edge of said clocking signal if said one or more bits indicate an early arrival time; and wherein the second device latches in the signal on a second edge of said clocking signal after said first edge if said one or more bits indicate a late arrival time.

10. The computer system of claim 6, wherein the second device uses said signal arrival information in said first bus cycle in determining when to latch in the signal in said first bus cycle.

11. The computer system of claim 6, wherein the second device uses said signal arrival information in a subsequent bus cycle after said first bus cycle in determining when to latch in the signal in said subsequent bus cycle.

12. The computer system of claim 11, wherein said signal arrival information comprises one or more bits indicating an early or late signal arrival time;

wherein the second device latches in the signal on a first edge of said clocking signal in said subsequent bus cycle if said one or more bits indicate an early arrival time; and wherein the second device latches in the signal on a second edge of said clocking signal after said first edge in said subsequent bus cycle if said one or more bits indicate a late arrival time.

13. The computer system of claim 12, wherein said subsequent cycle is the next cycle immediately after said first bus cycle.

14. A method for reducing the amount of time required for bus cycles in a computer system having a bus, a first device coupled to the bus which generates a signal, and a second device coupled to the bus which receives the signal as an input, wherein the second device includes a signal arrival encoder which encodes the arrival time of the signal, the method comprising the steps of:

the first device generating a signal on the bus to the second device on a first bus cycle;

the signal arrival encoder monitoring the arrival time of the signal to the second device on said first bus cycle;

the signal arrival encoder encoding said arrival time of the signal into signal arrival information;

the second device latching the signal, wherein the second device uses said signal arrival information in determining when to latch the signal.

15. The method of claim 14, wherein said step of the second device latching the signal occurs during said first bus cycle.

16. The method of claim 14, further comprising the step of:

the first device generating the signal on the bus to the second device in a subsequent bus cycle, wherein said subsequent bus cycle occurs after said first bus cycle and after said steps of monitoring and encoding;

wherein said step of the second device latching the signal occurs on said subsequent bus cycle, wherein the second device uses said signal arrival information in determining when to latch the signal.

17. The method of claim 14, wherein the bus operates according to a clocking signal and wherein the signal arrival encoder monitors the arrival time of the signal to the second device relative to said clocking signal.

18. The method of claim 14, wherein said step of the signal arrival encoder monitoring the arrival time of the signal to the second device on said first bus cycle comprises determining if the signal arrives before or after an edge of said clocking signal;

wherein said step of the signal arrival encoder encoding said arrival time of the signal into signal arrival information comprises encoding said arrival time of the signal into one or more bits indicating an early or late signal arrival time relative to said edge of said clocking signal.

19. The method of claim 18, wherein said signal arrival information comprises one or more bits indicating an early or late signal arrival time;

wherein said step of the second device latching the signal during said subsequent bus cycle using said signal arrival information further comprises:

the second device latching in the signal on a first edge of said clocking signal in said first bus cycle if said one or more bits indicate an early arrival time; and the second device latching in the signal on a second edge of said clocking signal after said first edge in said first bus cycle if said one or more bits indicate a late arrival time.

* * * * *